(12) United States Patent  (10) Patent No.: US 8,354,746 B2
Huang et al.  (45) Date of Patent: Jan. 15, 2013

(54) SEMICONDUCTOR PACKAGE AND METHOD OF FORMING Z-DIRECTION CONDUCTIVE POSTS EMBEDDED IN STRUCTURALLY PROTECTIVE ENCAPSULANT

(75) Inventors: Rui Huang, Singapore (SG); Il Kwon Shim, Singapore (SG); Seng Guan Chow, Singapore (SG); Heap Hoe Kuan, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/174,033

(22) Filed: Jun. 30, 2011

(65) Prior Publication Data

US 2011/0254157 A1  Oct. 20, 2011

Related U.S. Application Data

(62) Division of application No. 12/329,458, filed on Dec. 5, 2008, now Pat. No. 7,993,941.

(51) Int. Cl.
*H01L 21/00* (2006.01)
(52) U.S. Cl. ........... 257/690; 257/684; 257/787; 438/15
(58) Field of Classification Search .................. 257/684, 257/690, 787; 438/15
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,841,193 A | 11/1998 | Eichelberger | |
| 7,294,587 B2 * | 11/2007 | Asahi et al. | 438/782 |
| 7,619,901 B2 | 11/2009 | Eichelberger | |
| 7,719,121 B2 * | 5/2010 | Humpston et al. | 257/784 |
| 7,759,166 B2 * | 7/2010 | Haba et al. | 438/118 |
| 7,858,441 B2 * | 12/2010 | Lin et al. | 438/109 |
| 8,058,101 B2 * | 11/2011 | Haba et al. | 438/109 |
| 8,093,697 B2 * | 1/2012 | Haba et al. | 257/678 |
| 8,169,071 B2 * | 5/2012 | Jang et al. | 257/698 |
| 2003/0062624 A1 * | 4/2003 | Asahi et al. | 257/758 |
| 2006/0063312 A1 | 3/2006 | Kurita | |
| 2007/0026662 A1 | 2/2007 | Kawano et al. | |
| 2008/0023805 A1 * | 1/2008 | Howard et al. | 257/666 |
| 2008/0079163 A1 | 4/2008 | Kurita et al. | |
| 2008/0157402 A1 | 7/2008 | Ramakrishna et al. | |
| 2008/0296759 A1 | 12/2008 | Ramakrishna et al. | |
| 2012/0112340 A1 * | 5/2012 | Lin et al. | 257/734 |

* cited by examiner

*Primary Examiner* — Jarrett Stark
*Assistant Examiner* — Nicholas Tobergte
(74) *Attorney, Agent, or Firm* — Rodney D. Atkins; Patent Law Group: Atkins & Associates, P.C.

(57) ABSTRACT

A semiconductor package is made using a prefabricated post carrier including a base plate and plurality of conductive posts. A film encapsulant is disposed over the base plate of the post carrier and around the conductive posts. A semiconductor die is mounted to a temporary carrier. The post carrier and temporary carrier are pressed together to embed the semiconductor die in the film encapsulant. The semiconductor die is disposed between the conductive posts in the film encapsulant. The temporary carrier and base plate of the post carrier are removed. A first circuit build-up layer is formed over a first side of the film encapsulant. The first circuit build-up layer is electrically connected to the conductive posts. A second circuit build-up layer is formed over a second side of the film encapsulant opposite the first side. The second circuit build-up layer is electrically connected to the conductive posts.

26 Claims, 16 Drawing Sheets

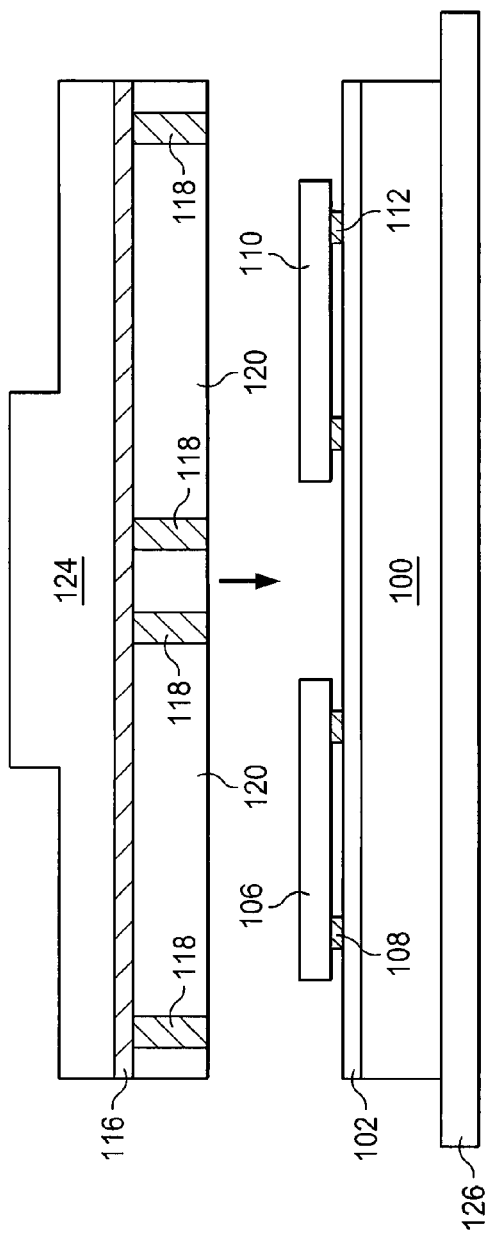
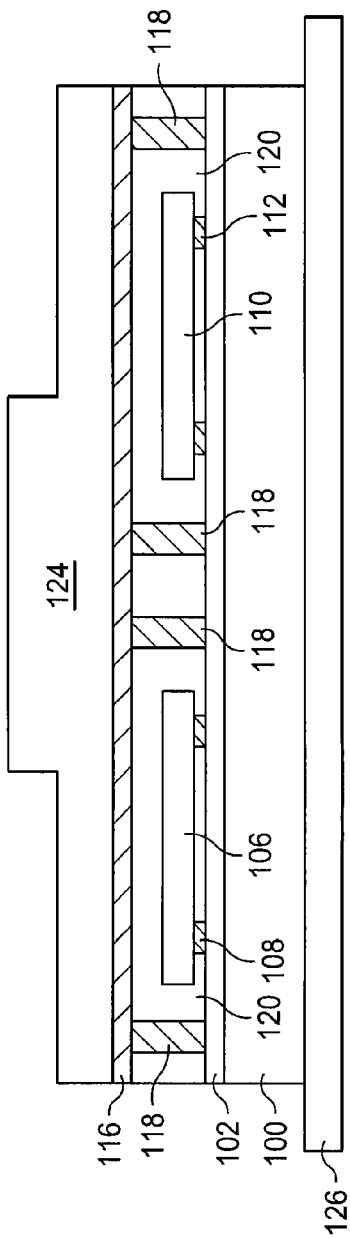
FIG. 3g
FIG. 3h

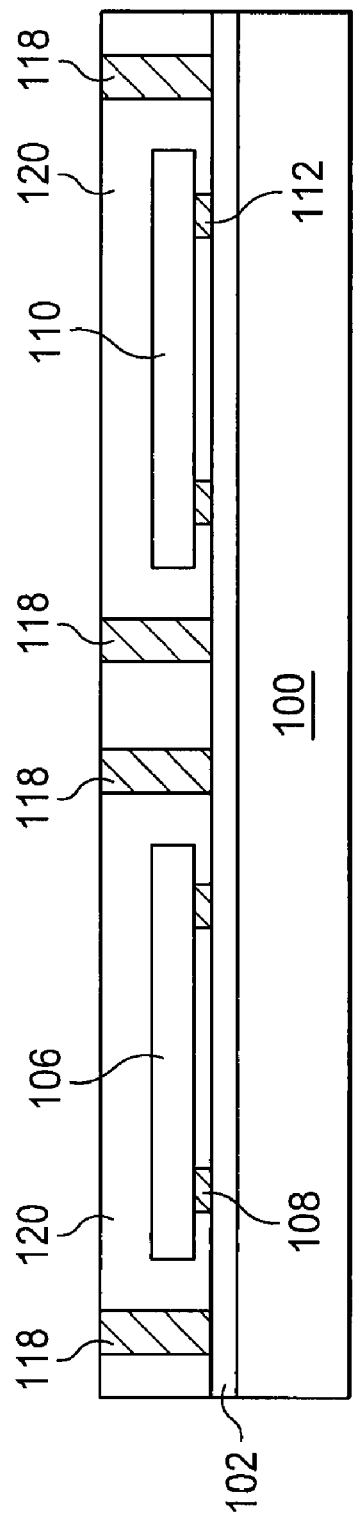
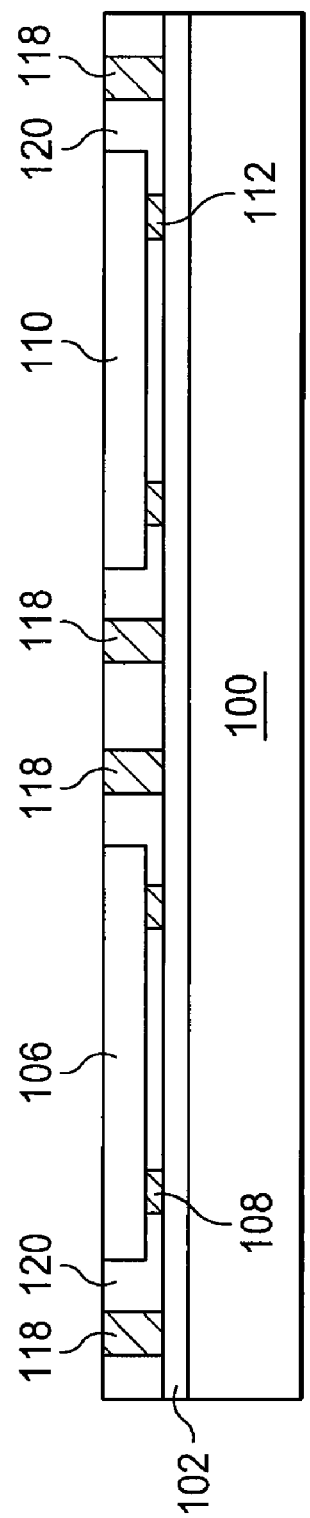
FIG. 3i
FIG. 3j

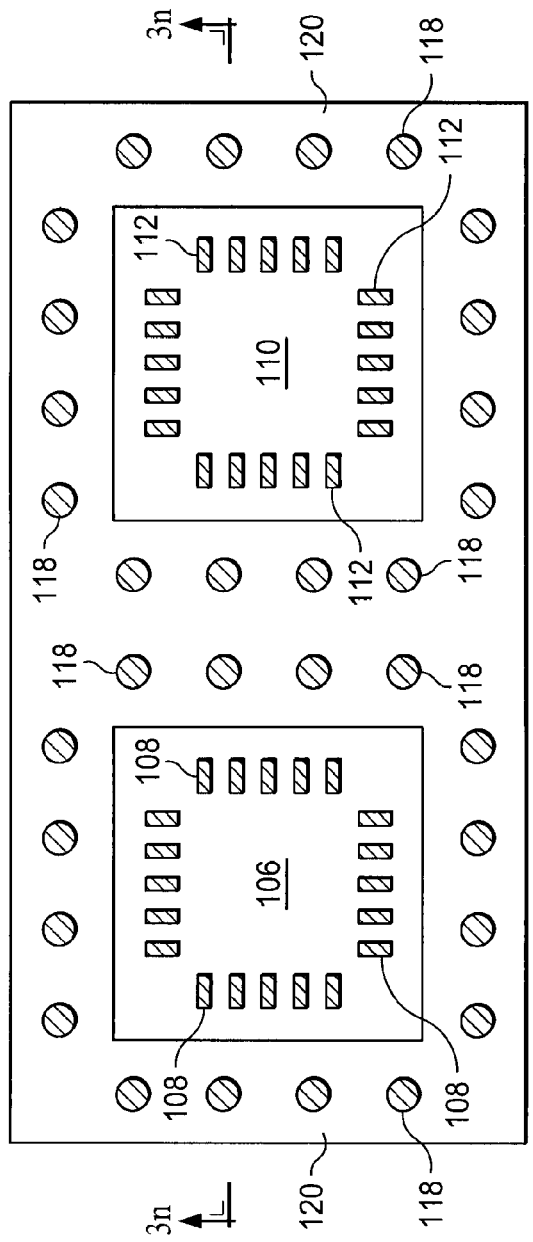
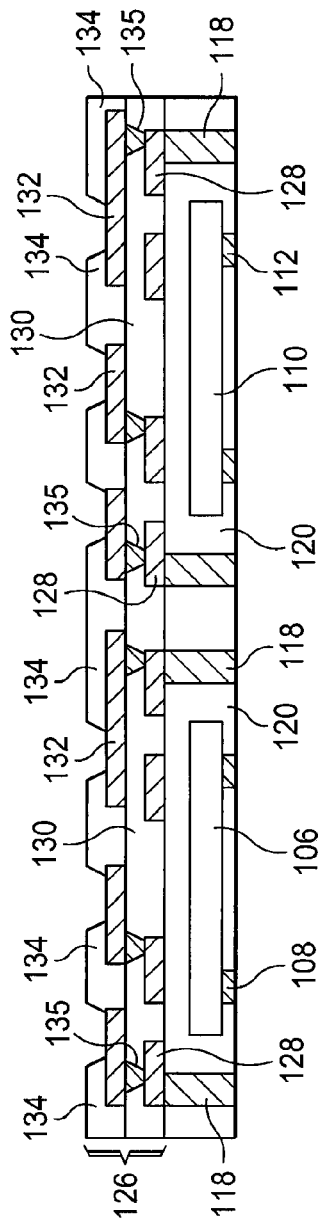
FIG. 3m
FIG. 3n

SEMICONDUCTOR PACKAGE AND METHOD OF FORMING Z-DIRECTION CONDUCTIVE POSTS EMBEDDED IN STRUCTURALLY PROTECTIVE ENCAPSULANT

CLAIM TO DOMESTIC PRIORITY

The present application is a division of U.S. patent application Ser. No. 12/329,458, filed Dec. 5, 2008, and claims priority to the foregoing parent application pursuant to 35 U.S.C. §120.

FIELD OF THE INVENTION

The present invention relates in general to semiconductor devices and, more particularly, to a semiconductor package having z-direction conductive posts embedded in a structurally protective encapsulant.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), or other inter-device interference, such as capacitive, inductive, or conductive coupling, also known as cross-talk.

In many applications, it is desirable to stack wafer level chip scale semiconductor packages for a higher level of circuit integration. In wafer level fan-out chip scale semiconductor packages, z-direction electrical interconnections have been provided to facilitate the electrical interconnect between the stacked packages. The z-direction electrical interconnects are typically formed by metal plating. The plating process is time consuming and adds manufacturing cost and complexity. Alternatively, the z-direction electrical interconnects can be formed by mechanical conductive bonding. However, the high aspect ratio of the z-direction electrical interconnects makes handling difficult leading to defects and reduced manufacturing yield.

SUMMARY OF THE INVENTION

A need exists to form z-direction electrical interconnects in wafer level chip scale semiconductor packages without plating or mechanical conductive bonding. Accordingly, in one embodiment, the present invention is a semiconductor device comprising a base plate having a plurality of conductive posts extending from the base plate. A film encapsulant is disposed over the base plate and around the conductive posts. A semiconductor die is embedded within the film encapsulant between the conductive posts. The conductive posts extend through the film encapsulant. A first interconnect structure is formed over a first surface of the film encapsulant. The first interconnect structure is electrically connected to the conductive posts. A second interconnect structure is formed over the semiconductor die and a second surface of the film encapsulant opposite the first surface of the film encapsulant. The second interconnect structure is electrically connected to the conductive posts.

In another embodiment, the present invention is a semiconductor device comprising a plurality of conductive posts and encapsulant deposited around the conductive posts. A semiconductor die is embedded in the encapsulant between the conductive posts. The conductive posts extend through the encapsulant. A first interconnect structure is formed over a first surface of the encapsulant. The first interconnect structure is electrically connected to the conductive posts.

In another embodiment, the present invention is a semiconductor device comprising a base plate having a plurality of conductive posts extending from the base plate. An encapsulant is disposed over the base plate and around the conductive posts. A semiconductor die is embedded within the encapsulant over the base plate between the conductive posts. The conductive posts extend through the encapsulant.

In another embodiment, the present invention is a semiconductor device comprising a base plate having a plurality of conductive posts extending from the base plate. An encapsulant is disposed over the base plate and around the conductive posts. A semiconductor die is embedded within the encapsulant between the conductive posts.

DETAILED DESCRIPTION OF THE DRAWINGS

Figure 1:
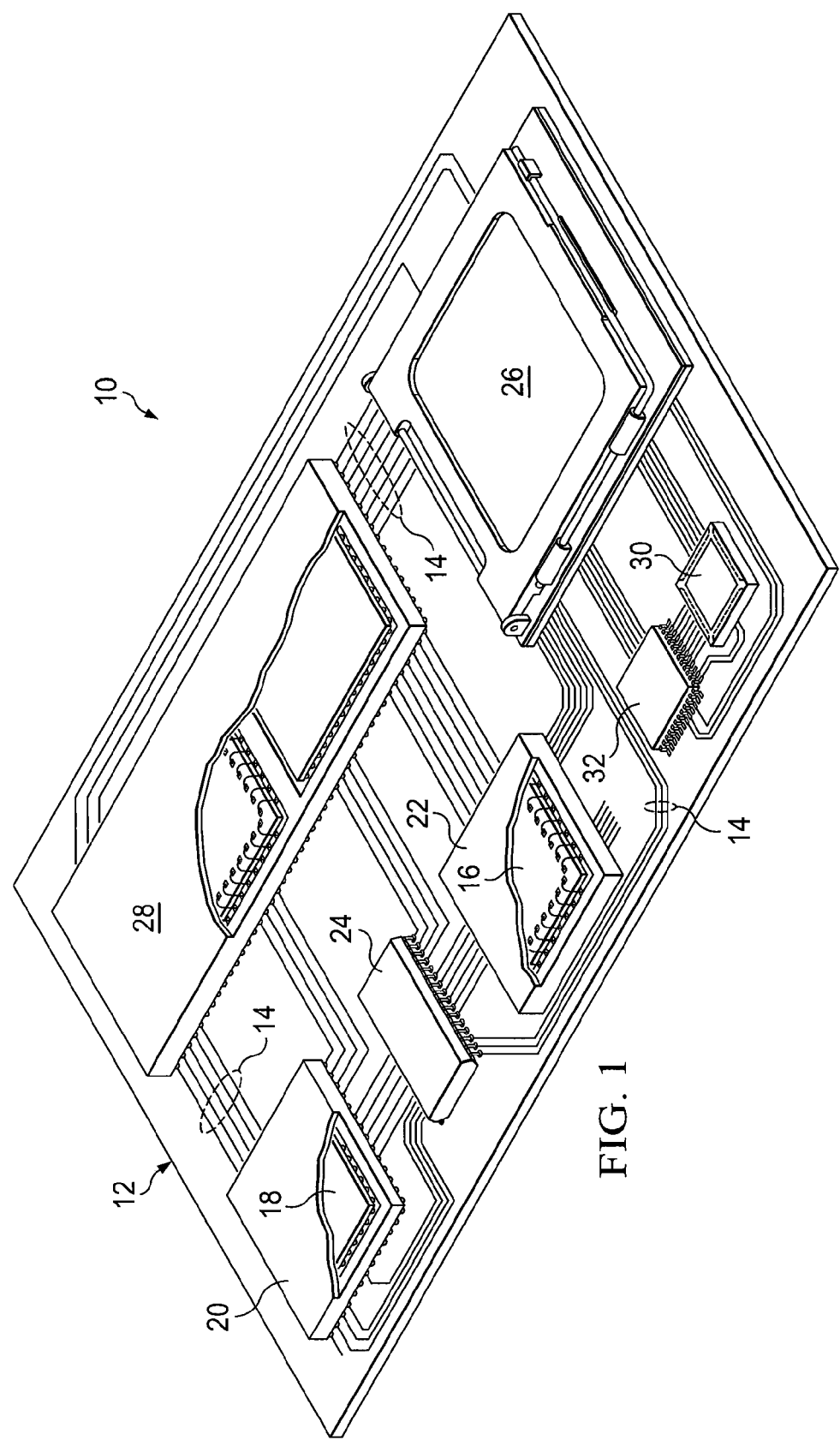
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is the technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
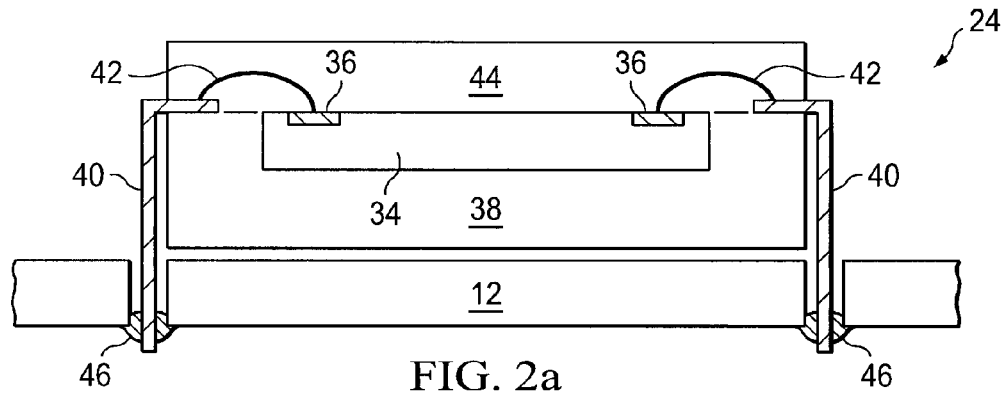
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active area containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active area of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
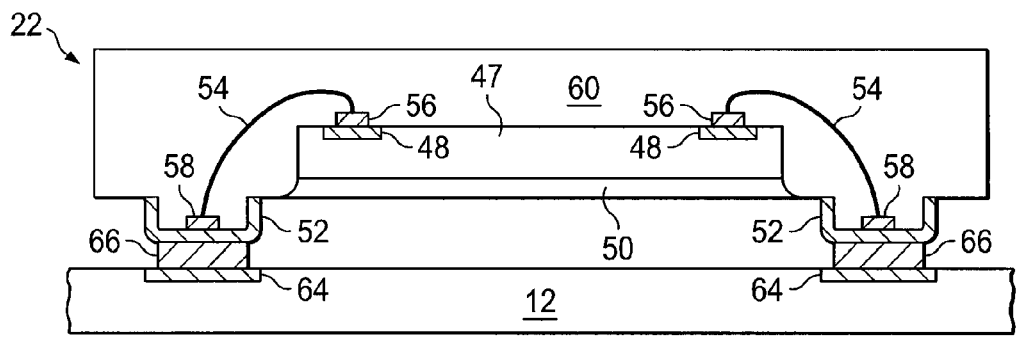

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active area containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active area of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
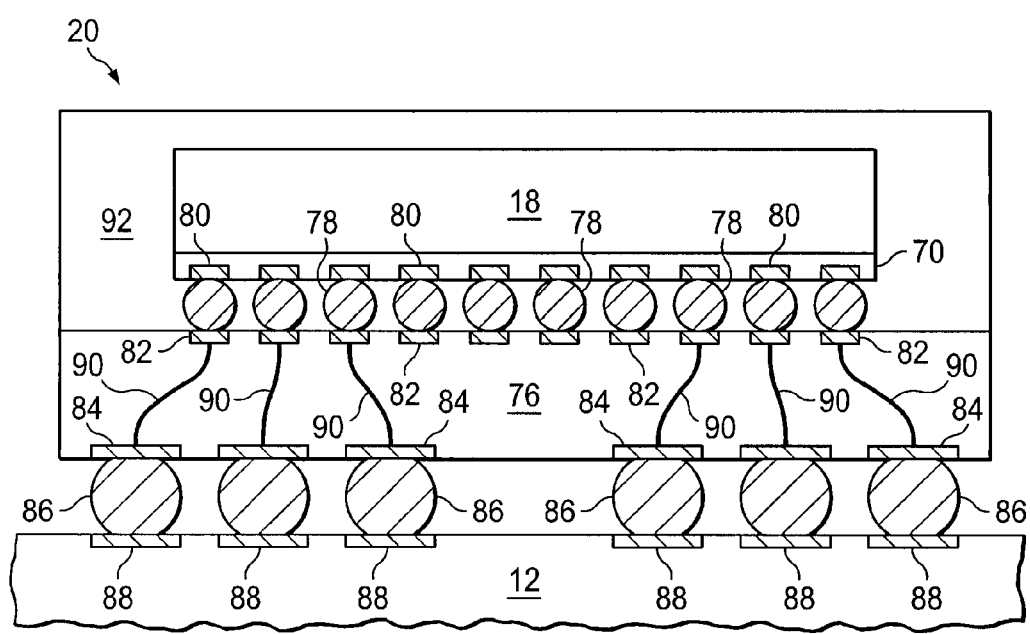

In FIG. 2c, semiconductor die 18 is mounted face down to carrier 76 with a flip chip style first level packaging. BGA 20 is attached to PCB 12 with a BGA style second level packaging. Active area 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active area 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active areas 70. Bump pads 80 are made with a conductive material, such as Al, Cu, Sn, Ni, Au, or Ag, and are electrically connected to the circuit elements formed in active area 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
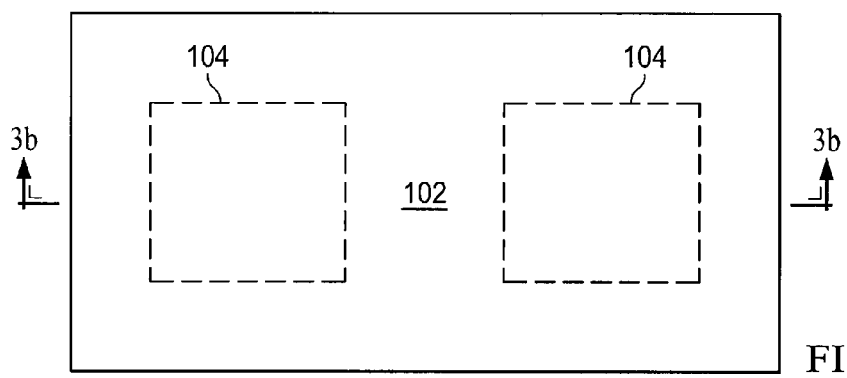
FIGS. 3a-3r illustrate a process of forming z-direction conductive posts embedded in a structurally protective encapsulant for a wafer level chip scale package.
Figure 3B:
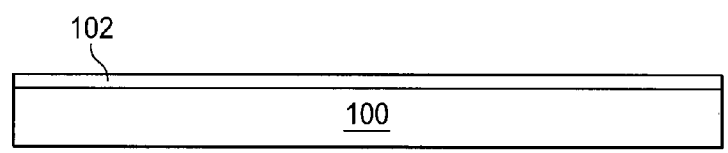
Figure 3C:
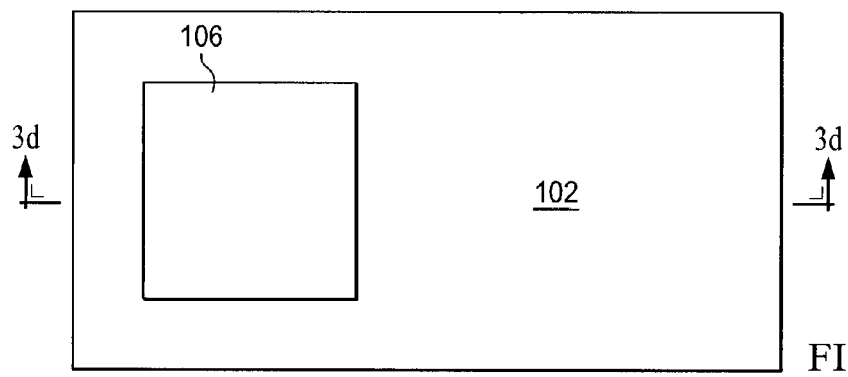
Figure 3D:
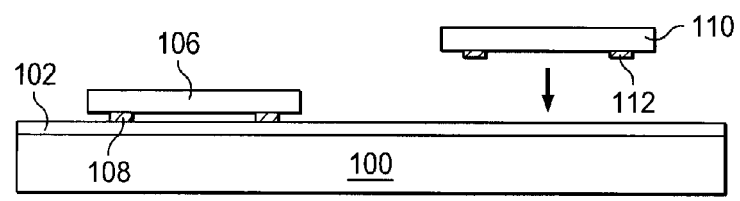
Figure 3E:
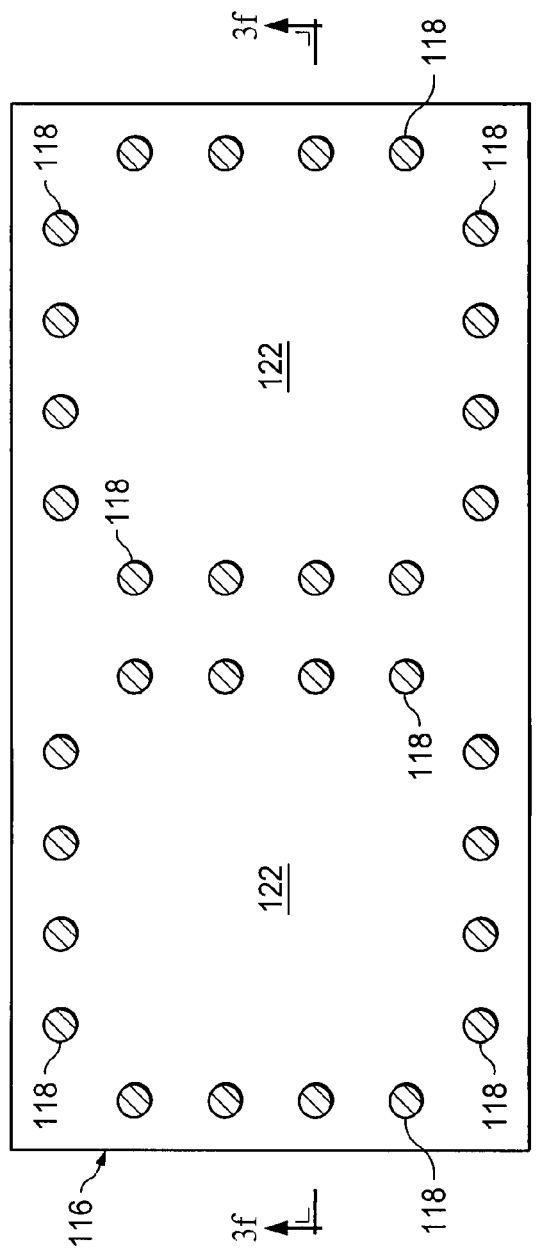
Figure 3F:
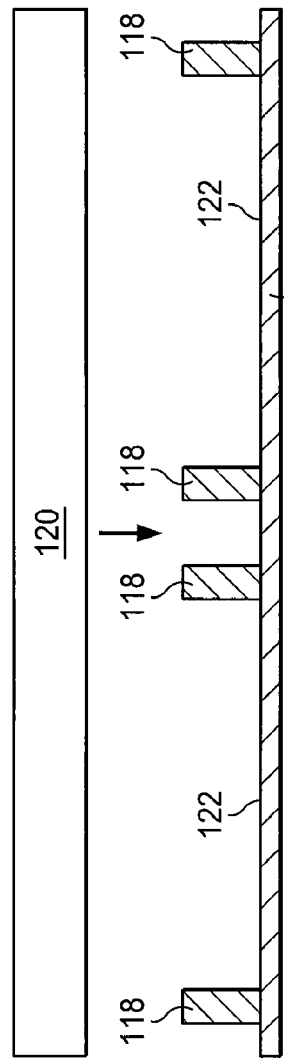
Figure 3K:
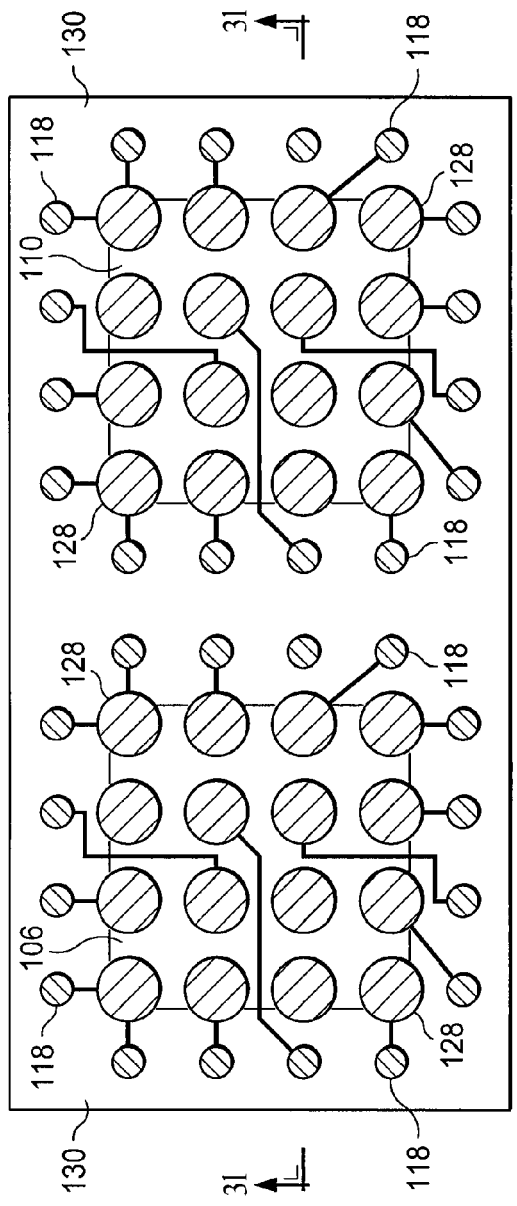
Figure 3L:
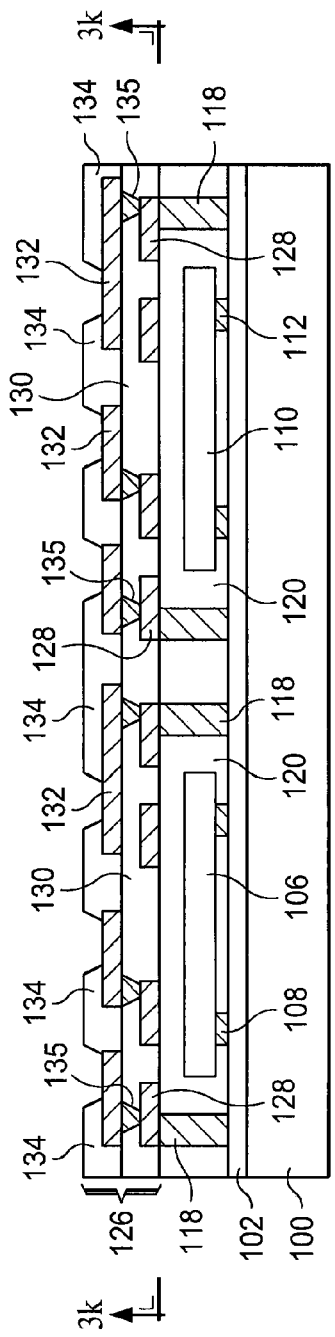
Figure 3O:
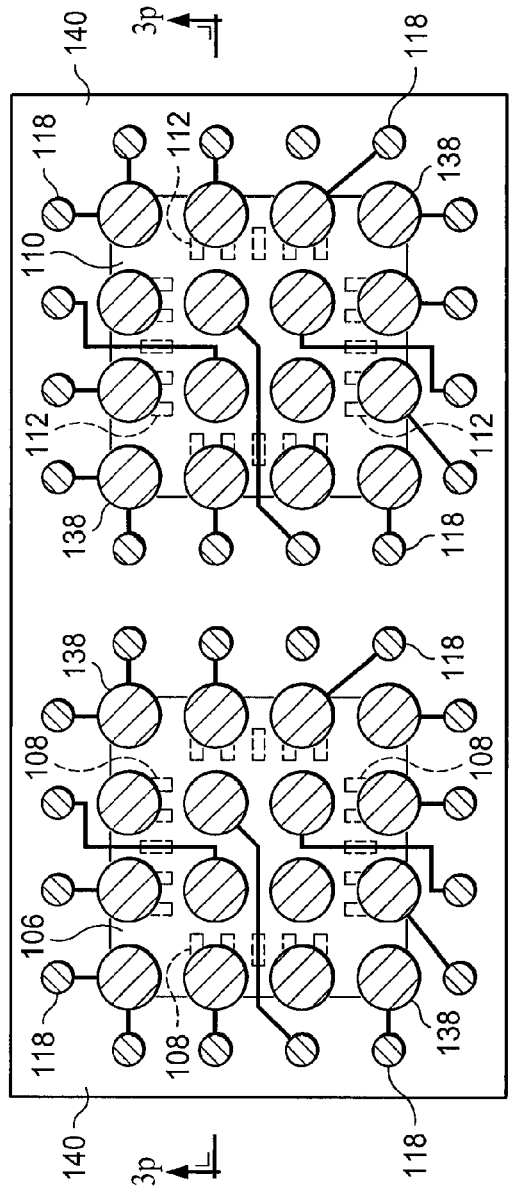
Figure 3P:
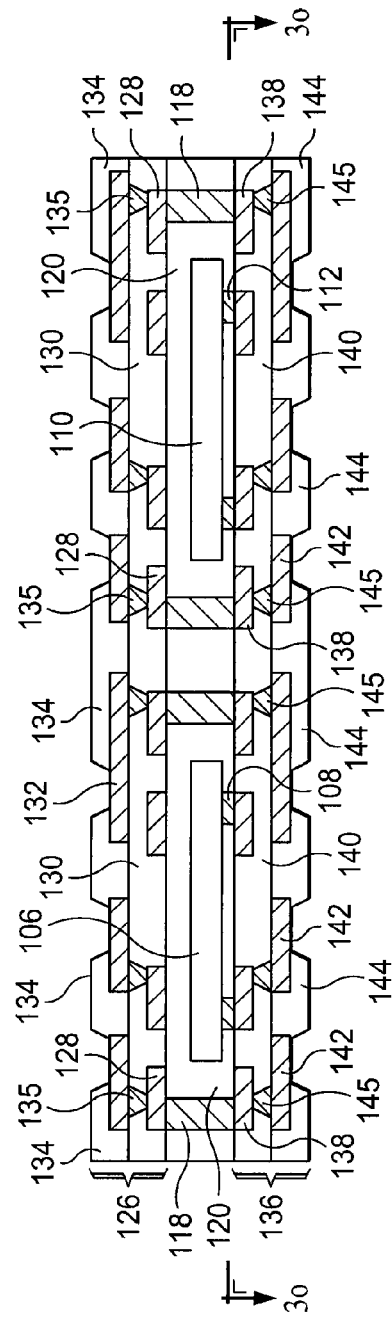
Figure 3Q:
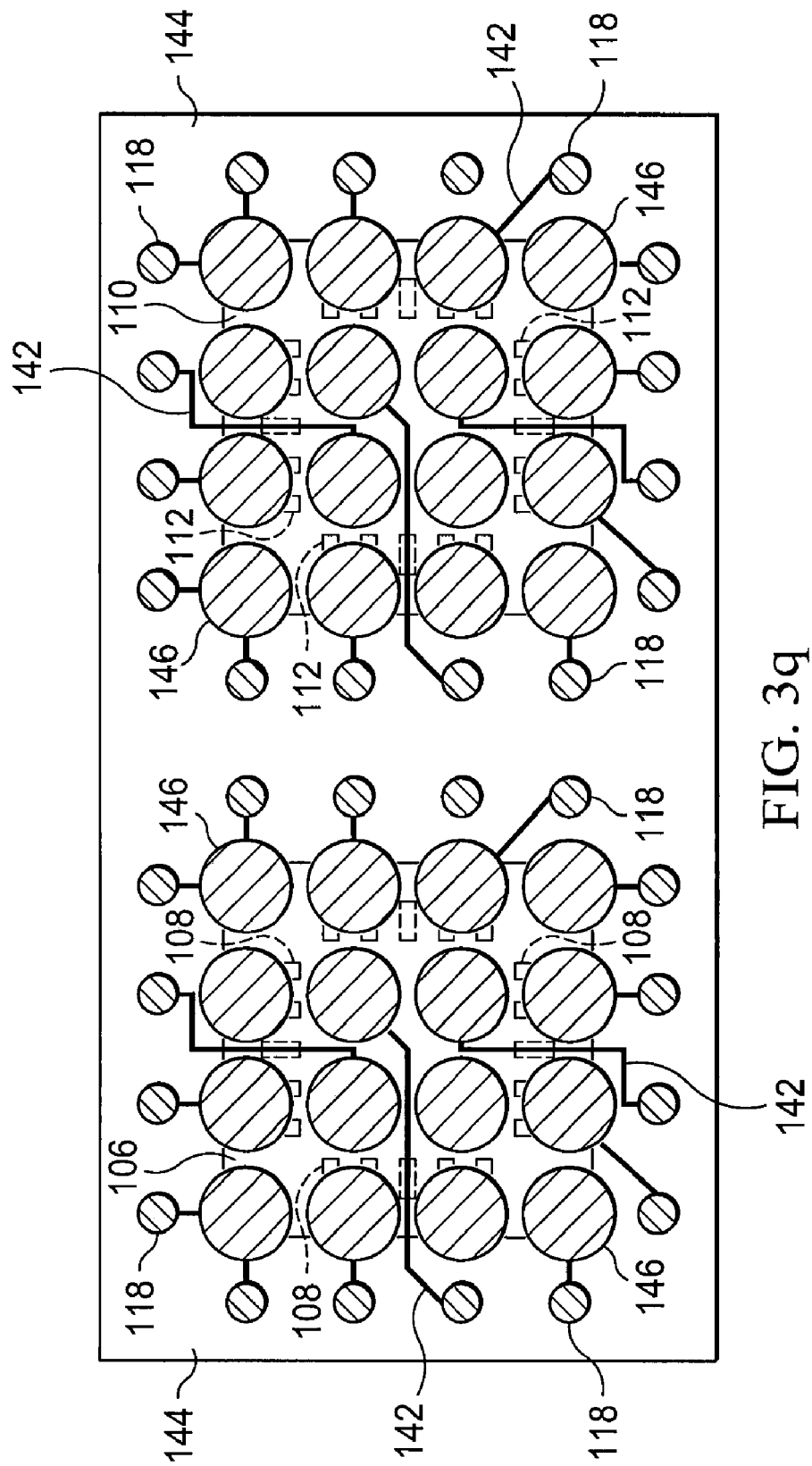
Figure 3R:
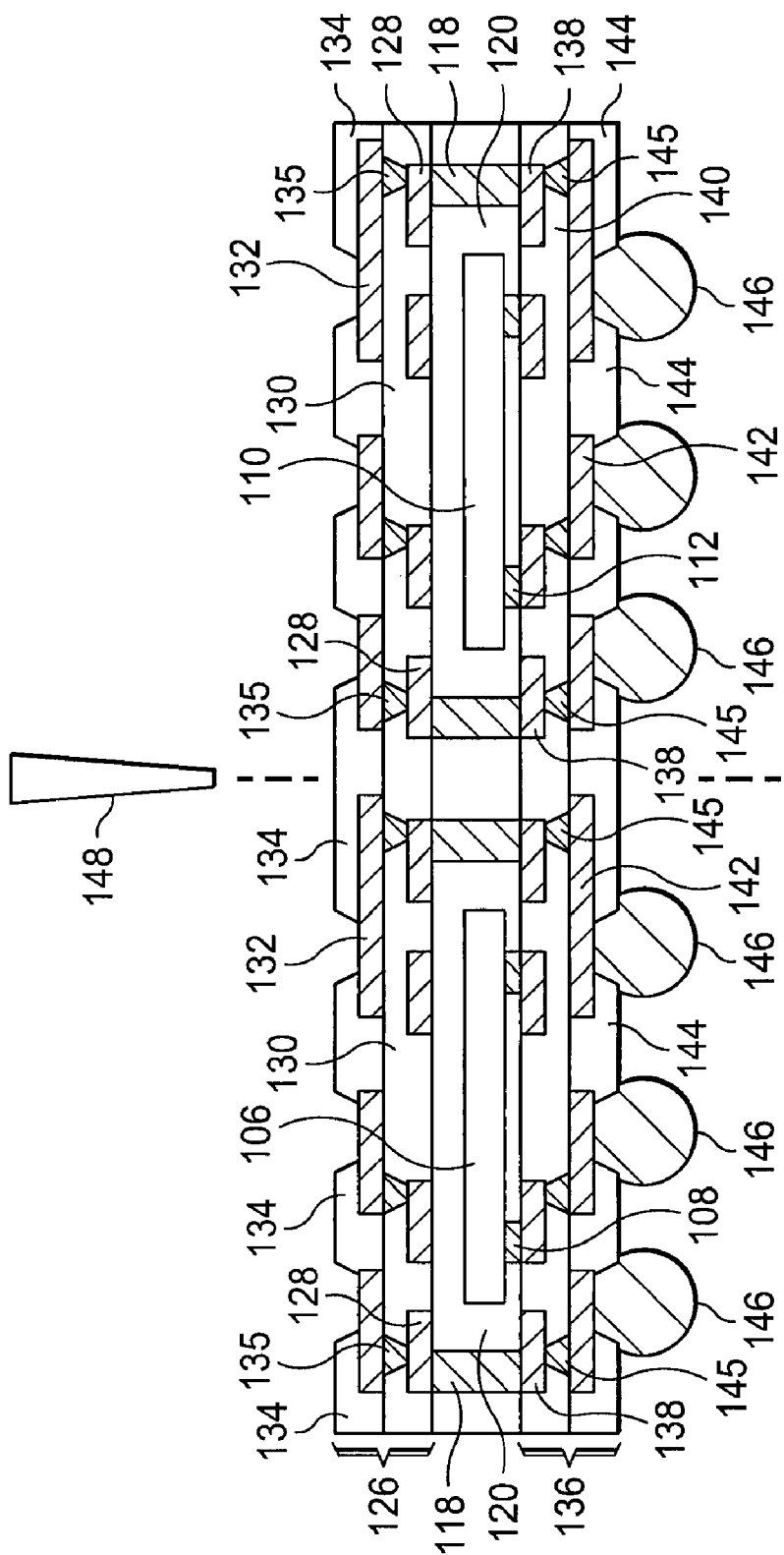

FIGS. 3a-3r illustrate a process of forming a wafer level fan-out chip scale semiconductor package using a film encapsulant to structurally support and protect z-direction conductive posts during fabrication. FIGS. 3a-3b show a top view and cross-sectional view of a temporary process carrier or substrate 100 with an adhesive layer 102 deposited on its surface. Carrier 100 is a wafer-shaped dummy or sacrificial base material such as silicon, ceramic, glass, metal, or other suitable low-cost, rigid material. Adhesive layer 102 can be a flexible plastic base film, such as polyvinyl chloride (PVC) or polyolefin, with a synthetic acrylic adhesive or ultraviolet (UV)-sensitive adhesive, for device mounting and removal. Adhesive layer 102 is releasable by light, heat, laser, or mechanical pressure. Adhesive layer 102 is deposited using spin coating or printing, and may include a laminated polymer adhesive or UV curable liquid adhesive. Alternately, an adhesive material such as thermal epoxy, polymer composite, or inorganic bonding compounds, can be applied to carrier 100. Alignment marks 104, such as grooves or plating lines, are provided for placement of semiconductor die in an array format. Alignment marks 104 are optional. Other alignment methods can be used to place the semiconductor die on carrier 100.

FIGS. 3c and 3d show a top view and cross-sectional view of semiconductor die 106 placed on adhesive layer 102 with contact pads 108 oriented toward the adhesive layer. Semiconductor die 110 is also placed on adhesive layer 102 with contact pads 112 oriented toward the adhesive layer.

FIG. 3e shows a prefabricated post carrier 116 with conductive posts 118 oriented in the z-direction or perpendicular with respect to the base plate of the post carrier. Post carrier 116 and conductive posts 118 are typically Cu but can also be other suitable electrically conductive materials. Conductive posts 118 are round or square in shape and arranged in a rectangular array, such as a strip form, but can also be in the form of a wafer. FIG. 3f is a cross-sectional view taken along line 3f of post carrier 116. A film encapsulant 120 is placed over and pressed onto post carrier 116. In one embodiment, film encapsulant 120 is a tape or sheet of wire-on-film (WIF) material. Alternatively, film encapsulant 120 is an encapsulant or molding compound deposited over post carrier 116 using a screen printing, compressive molding, transfer molding, liquid encapsulant molding, liquid dispensing, or other suitable applicator. The encapsulant can be liquid epoxy, powder, epoxy resin, epoxy acrylate, polymer, or polymer composite material. Film encapsulant 120 contacts base plate 122 of post carrier 116 and encloses conductive posts 118 for structural support and protection during later processes. Thus, conductive posts 118 are embedded in encapsulant 120. The volume of encapsulant can be controlled by selecting the thickness of film encapsulant 120 or by removing excess encapsulant from the periphery of the semiconductor package following singulation. In one embodiment, film encapsulant 120 is 25-300 micrometers (μm).

In FIG. 3g, post carrier 116 is inverted and vacuum press 124 is applied to the backside of post carrier 116, opposite conductive posts 118. Heat press 126 is applied to the backside of carrier 100, opposite semiconductor die 106 and 110. Vacuum press 124 and heat press 126 are pressed together using pressure and heat until film encapsulant 120 encloses or embeds semiconductor die 106 and 110, as shown in FIG. 3h. Thus, semiconductor die 106 and 110 are embedded in encapsulant 120. After the pressing operation, conductive posts 118 extend down to adhesive layer 102 and surround semiconductor die 106 and 110.

In FIG. 3i, film encapsulant 120 is cured and hardened. Base plate 122 of post carrier 116 is removed by chemical etching or mechanical grinding, leaving conductive posts 118 embedded and isolated in film encapsulant 120. Alternatively, a portion of film encapsulant 120 and conductive posts 118 is also removed to expose a top surface of semiconductor die 106 and 110, as shown in FIG. 3j. In either case, conductive posts 118 are exposed from film encapsulant 120.

FIGS. 3k and 3l show a top view and cross-sectional view of a top-side circuit build-up layer 126 formed over film encapsulant 120 and conductive posts 118. Circuit build-up layer 126 includes conductive layers 128 and 132, and insulating layers 130 and 134. Conductive layers 128 and 132 can be Al, Cu, Sn, Ni, Au, Ag, or other suitable electrically conductive material. Conductive layers 128 and 132 are formed by PVD, CVD, electrolytic plating, or electroless plating process. Conductive layers 128 and 132 are electrically connected by conductive via 135. Conductive layer 128 electrically connects to conductive posts 118. Conductive layer 132 can be redistribution layers (RDL) or external contact pads. The insulating layers 130 and 134 can be silicon dioxide (SiO2), silicon nitride (Si3N4), silicon oxynitride (SiON), tantalum pentoxide (Ta2O5), zircon (ZrO2), aluminum oxide (Al2O3), or other material having suitable insulating properties. The deposition of insulating layer 134 may involve PVD, CVD, printing, sintering, or thermal oxidation. The insulating layer 134 can be single or multiple layers.

Circuit build-up layer 126 further includes thin film semiconductor devices, such as active devices or integrated passive devices (IPD), such as inductors, resistors, and capacitors. The thin film semiconductor circuit elements provide in part the necessary functionality of the semiconductor device. Film encapsulant 120 maintains the structural integrity of conductive posts 118 during formation of the semiconductor package, including circuit build-up layer 126.

FIGS. 3m and 3n show a top view and cross-sectional view of the assembly following removal of carrier 100 and adhesive layer 102. Carrier 100 and adhesive layer 102 are removed by chemical etching, mechanical peel-off, or mechanical grinding. Conductive posts 118 are exposed from film encapsulant 120 following removal of carrier 100 and adhesive layer 102.

FIGS. 3o and 3p show a top view and cross-sectional view of a bottom-side circuit build-up layer 136 formed over film encapsulant 120 and conductive posts 118, opposite top-side circuit build-up layer 126. Circuit build-up layer 136 includes conductive layers 138 and 142 and insulating layers 140 and 144. Conductive layer 138 and 142 can be Al, Cu, Sn, Ni, Au, Ag, or other suitable electrically conductive material. Conductive layers 138 and 142 are formed by PVD, CVD, electrolytic plating, or electroless plating process. Conductive layers 138 and 142 are electrically connected by conductive via 145. Conductive layer 138 electrically connects to conductive posts 118. Conductive layer 142 can be RDLs or external contact pads. The insulating layers 140 and 144 can be SiO2, Si3N4, SiON, Ta2O5, ZrO2, Al2O3, or other material having suitable insulating properties. The deposition of insulating layer 144 may involve PVD, CVD, printing, sintering, or thermal oxidation. The insulating layer 144 can be single or multiple layers.

Circuit build-up layer 136 further includes thin film semiconductor devices, such as active devices or IPDs, such as inductors, resistors, and capacitors. The thin film semiconductor circuit elements provide in part the necessary functionality of the semiconductor device. Film encapsulant 120 maintains the structural integrity of conductive posts 118 during formation of the semiconductor package, including circuit build-up layer 136.

An electrically conductive solder material is deposited over conductive layer 142 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high lead, or lead free. The solder material is reflowed by heating the material above its melting point to form spherical balls or bumps 146, as shown in a top view in FIG. 3q and cross-sectional view in FIG. 3r. In some applications, solder bumps 146 are reflowed a second time to improve electrical contact to conductive layer 142. Solder bumps 146 represent one type of interconnect structure that can be formed on conductive layer 142. The interconnect structure can also use bond wires, 3D interconnects, conductive paste, or other electrical interconnect. The assembly in FIG. 3r is singulated with saw blade or laser tool 148 into individual wafer level chip scale semiconductor packages.

Figure 4:
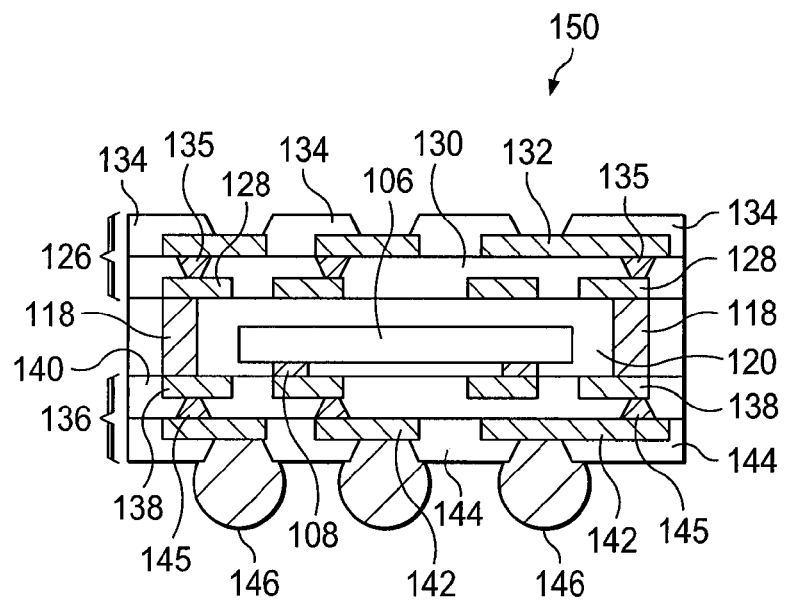
FIG. 4 illustrates a semiconductor package with the z-direction conductive posts embedded in the encapsulant.

FIG. 4 shows one singulated semiconductor package 150 following singulation. Semiconductor die 106 is enclosed or embedded in film encapsulant 120 between conductive posts 118. Circuit build-up layer 126, including conductive layers 128 and 132, insulating layers 130 and 134, and conductive via 135, is formed over one side of film encapsulant 120. Circuit build-up layer 136, including conductive layers 138 and 142, insulating layers 140 and 144, and conductive via 145, is formed over on opposite side of film encapsulant 120. Semiconductor die 106 electrically connects through contact pads 108, conductive layers 138, conductive via 145, and conductive layer 142 to solder bumps 146. Semiconductor die 106 further electrically connects through conductive posts 118 to conductive layers 128, conductive via 135, and conductive layer 132.

Figure 5:
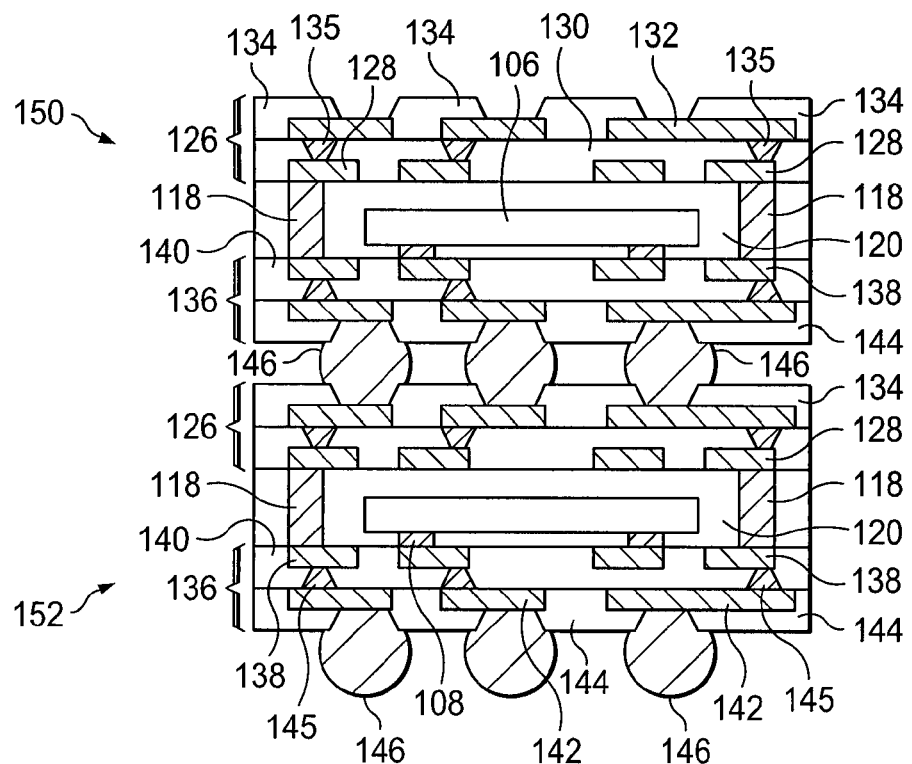
FIG. 5 illustrates a plurality of stacked semiconductor packages electrically interconnected with the z-direction conductive posts.

FIG. 5 shows vertically stacked semiconductor packages 150 and 152. Semiconductor die 106 in semiconductor package 150 electrically connects to semiconductor die 106 in semiconductor package 152 through contact pads 108, conductive layers 128, 132, 138, and 142, conductive vias 135 and 145, conductive posts 118, and solder bumps 146.

Figure 6A:
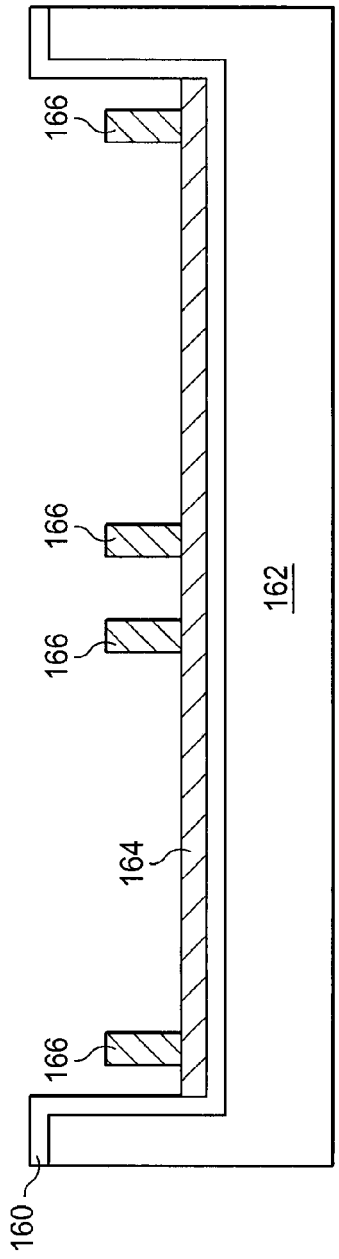
FIGS. 6a-6c illustrate an alternate process of forming z-direction conductive posts embedded in a structurally protective encapsulant for a wafer level chip scale package.
Figure 6B:
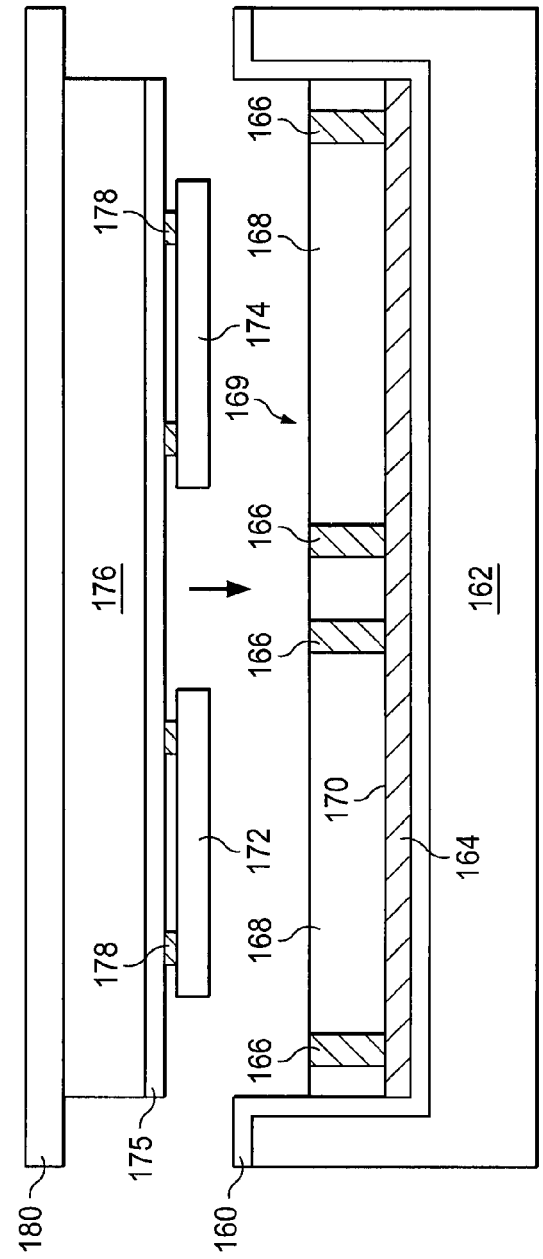
Figure 6C:
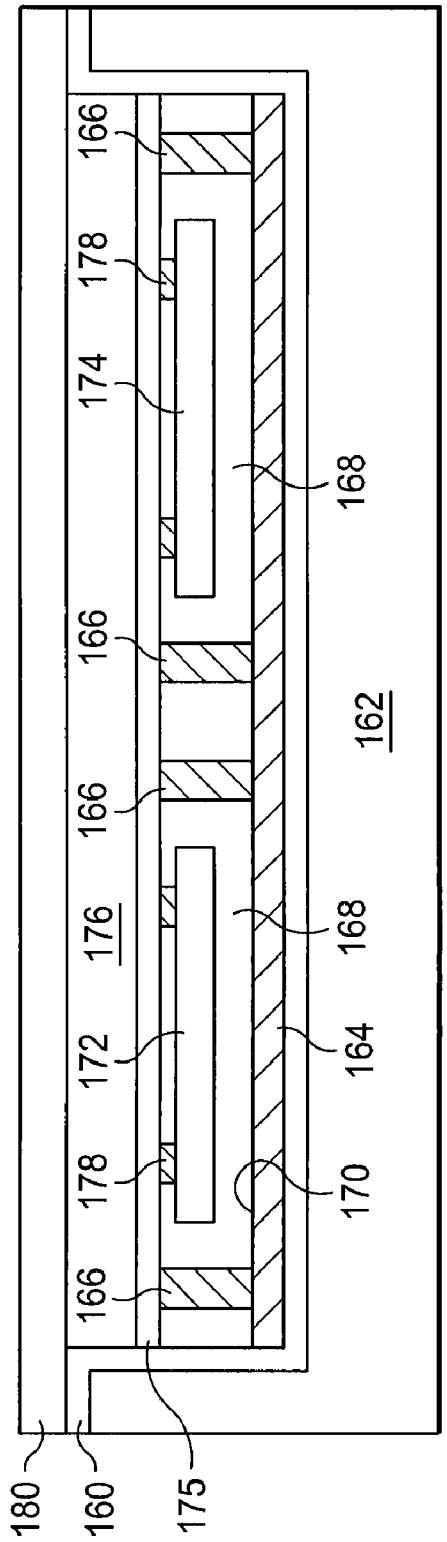

FIGS. 6a-6c illustrate an alternate process of forming a wafer level fan-out chip scale semiconductor package using a film encapsulant to structurally support and protect z-direction conductive posts during fabrication. In FIG. 6a, an adhesive layer 160 is placed over vacuum/heat press 162. Adhesive layer 160 can be a flexible plastic base film, such as PVC or polyolefin, with a synthetic acrylic adhesive or UV-sensitive adhesive, for device mounting and removal. In one embodiment, adhesive layer 160 is a release film which is feed by roller and reel.

A prefabricated post carrier 164 with conductive posts 166 is disposed over adhesive layer 160. Conductive posts 166 are oriented in the z-direction or perpendicular with respect to post carrier 164. Post carrier 164 and conductive posts 166 are typically Cu or other suitable electrically conductive material. Conductive posts 166 are round or square in shape and arranged in a rectangular array, such as a strip form, but can also be in the form of a wafer.

In FIG. 6b, a powder molding compound 168 is deposited into cavity 169 over post carrier 164 and conductive posts 166. The powder molding compound 168 is melted by thermal energy from vacuum/heat press 162. Film encapsulant 168 contacts base plate 170 of post carrier 164 and encloses conductive posts 166 for structural support and protection during later processes.

Semiconductor die 172 and 174 are held by adhesive layer 175 or vacuum to temporary carrier 176 with contact pads 176 and 178 oriented toward carrier 176. Carrier 176 is a wafer-shaped dummy or sacrificial base material such as silicon, ceramic, glass, metal, or other suitable low-cost, rigid material. Vacuum press 180 is applied to the backside of carrier 176, opposite semiconductor die 172 and 174. Vacuum press 180 and vacuum/heat press 162 are pressed together using vacuum pressure and heat until the melted molding compound 168 encloses and embeds semiconductor die 172 and 174, as shown in FIG. 6c.

The molding compound 168 is cured and hardened. Carrier 176 and adhesive layer 175 are removed by chemical etching, mechanical peel-off, or mechanical grinding. The base plate 170 of post carrier 164 is also removed by chemical etching or mechanical grinding, leaving conductive posts 166 embedded and isolated in molding compound 168. Conductive posts 166 are exposed on both sides of molding compound 168.

As described in FIGS. 3k and 3l, a top-side circuit build-up layer like 126 is formed over molding compound 168 and conductive posts 166. Likewise, a bottom-side circuit build-up layer like 136 is formed over molding compound 168 and conductive posts 166, similar to FIGS. 3o and 3p. The molding compound 168 maintains the structural integrity of conductive posts 166 during formation of the semiconductor package, including the circuit build-up layers. An interconnect structure, such as described in FIG. 3q, is formed on one or more of the circuit build-up layers. The assembly is singulated into individual stackable semiconductor packages, similar to FIGS. 4 and 5.

Figure 7A:
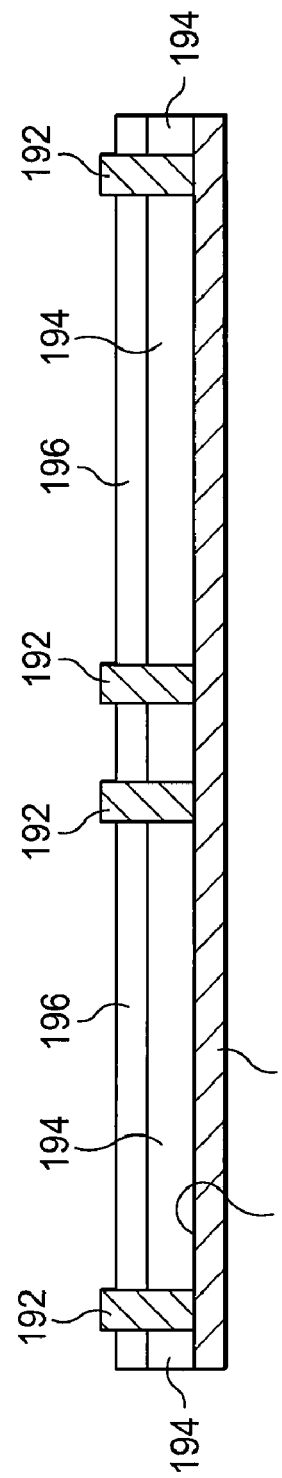
FIGS. 7a-7c illustrate a process of forming z-direction conductive posts with multiple encapsulant layers.
Figure 7B:
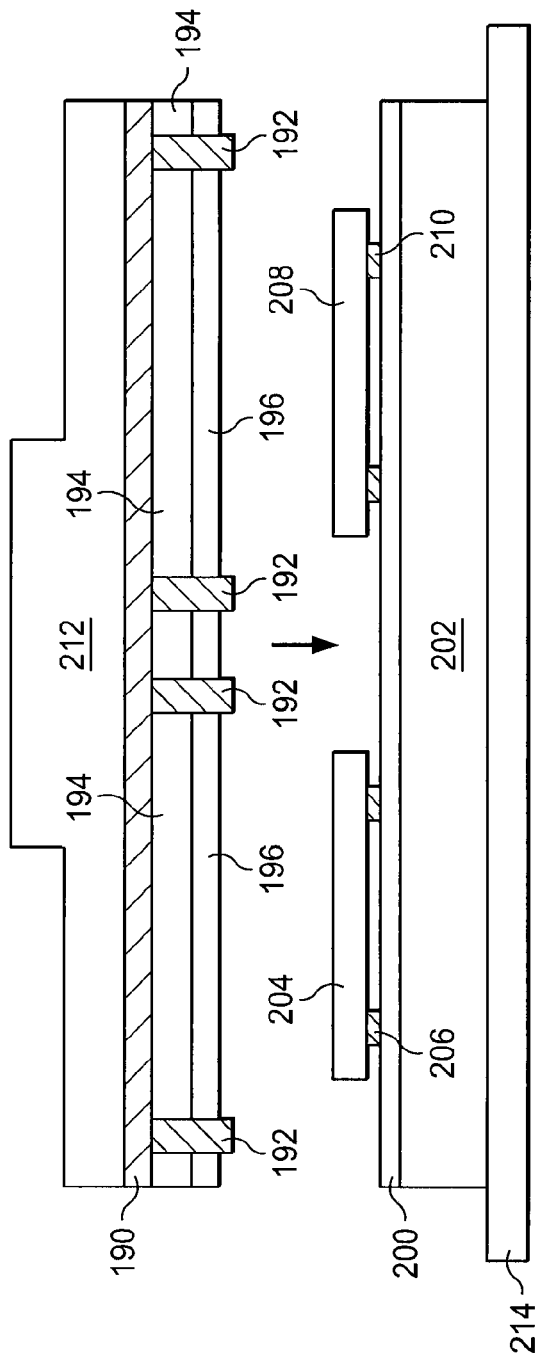
Figure 7C:
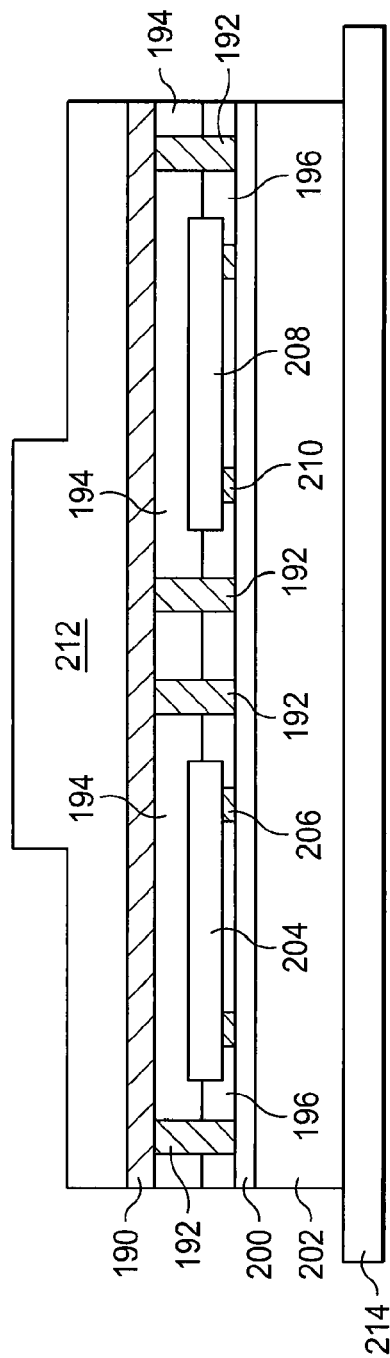

FIGS. 7a-7c illustrate another process of forming a wafer level fan-out chip scale semiconductor package using a film encapsulant to structurally protect z-direction conductive posts during fabrication. In FIG. 7a, a prefabricated post carrier 190 is provided with conductive posts 192 oriented in the z-direction or perpendicular with respect to the post carrier. Post carrier 190 and conductive posts 192 are typically Cu or other suitable electrically conductive material. Conductive posts 192 are round or square in shape and arranged in a rectangular array, such as a strip form, but can also be in the form of a wafer. A first film encapsulant 194 is placed over and pressed onto post carrier 190. The first film encapsulant 194 is less than a height of conductive posts 192, e.g., 50% of height of the conductive posts. A second film encapsulant 196 is laid over film encapsulant 194 and pressed onto post carrier 190. In one embodiment, film encapsulants 194-196 are each tape or sheet of WIF material. Film encapsulant 194 contacts base plate 198 of post carrier 190. Film encapsulants 194-196 enclose a substantial portion of conductive posts 192 for structural support and protection during later processes. Film encapsulant 196 further provides package rigidity and reduces package warpage.

In FIG. 7b, an adhesive layer 200 is deposited on a surface of temporary process carrier or substrate 202. Carrier 202 is a wafer-shaped dummy or sacrificial base material such as silicon, ceramic, glass, metal, or other suitable low-cost, rigid material. Adhesive layer 200 can be a flexible plastic base film, such as PVC or polyolefin, with a synthetic acrylic adhesive or ultraviolet UV-sensitive adhesive, for device mounting and removal. Adhesive layer 200 is releasable by light, heat, laser, or mechanical pressure. Adhesive layer 200 is deposited using spin coating or printing, and may include a laminated polymer adhesive or UV curable liquid adhesive. Alternately, an adhesive material such as thermal epoxy, polymer composite, or inorganic bonding compounds, can be applied to carrier 202.

Semiconductor die 204 is mounted to adhesive layer 200 with contact pads 206 oriented toward the adhesive layer. Semiconductor die 208 is also mounted to adhesive layer 200 with contact pads 210 oriented toward the adhesive layer.

Post carrier 190 is inverted and vacuum press 212 is applied to the backside of post carrier 190, opposite conductive posts 192. Heat press 214 is applied to the backside of carrier 202, opposite semiconductor die 204 and 208. Vacuum press 212 and heat press 214 are pressed together using vacuum pressure and heat until film encapsulants 194-196 encloses and embeds semiconductor die 204 and 208, as shown in FIG. 7c. Note that prior to the pressing operation conductive posts 192 protrude from film encapsulant 196 by a distance equal to the volume of semiconductor die 204 and 208. Accordingly, after the pressing operation, film encapsulant 196 is substantially flush with conductive posts 192.

The film encapsulants 194-196 are cured and hardened. The base plate 198 of post carrier 190 is removed by chemical etching or mechanical grinding, leaving conductive posts 192 embedded and isolated in film encapsulants 194-196. Conductive posts 192 are exposed from film encapsulant 196.

As described in FIGS. 3k and 3l, a top-side circuit build-up layer like 126 is formed over encapsulant 196 and conductive posts 192. Likewise, a bottom-side circuit build-up layer like 136 is formed over encapsulant 196 and conductive posts 192, similar to FIGS. 3o and 3p. The film encapsulants 194-196 maintain the structural integrity of conductive posts 192 during formation of the semiconductor package, including the circuit build-up layers. An interconnect structure, such as described in FIG. 3q, is formed on one or more of the circuit build-up layers. The assembly is singulated into individual stackable wafer level chip scale semiconductor packages.

Figure 8:
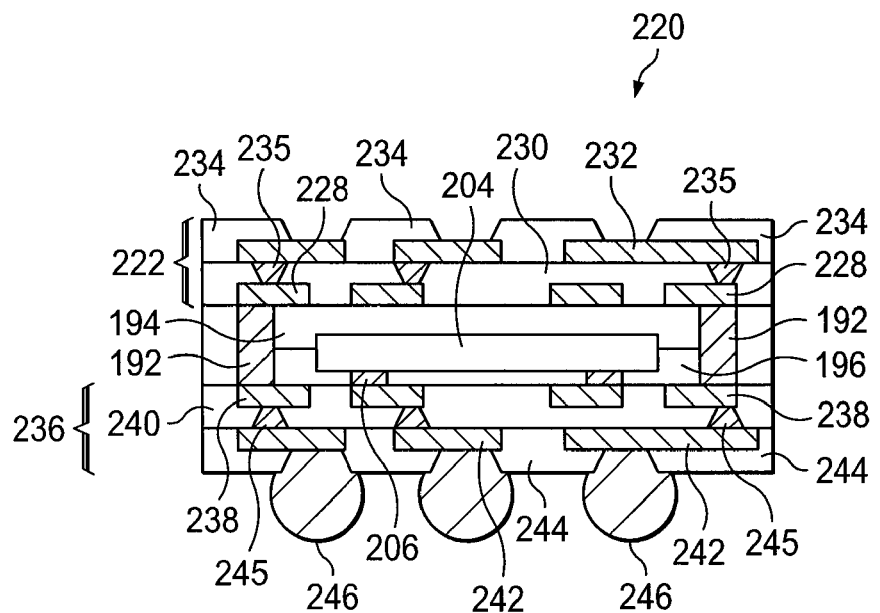
FIG. 8 illustrates a semiconductor package with the z-direction conductive posts embedded in multiple encapsulant layers.

FIG. 8 shows one singulated semiconductor package 220 following singulation. Semiconductor die 204 is enclosed and embedded in film encapsulants 194-196 between conductive posts 192. A top-side circuit build-up layer 222 is formed over film encapsulant 196 and conductive posts 192. Circuit build-up layer 222 includes conductive layers 228 and 232 and insulating layers 230 and 234. Conductive layers 228 and 232 can be Al, Cu, Sn, Ni, Au, Ag, or other suitable electrically conductive material. Conductive layers 228 and 232 are formed by PVD, CVD, electrolytic plating, or electroless plating process. Conductive layers 228 and 232 are electrically connected by conductive via 235. Conductive layer 228 electrically connects to conductive posts 192. Conductive layer 232 can be RDLs or external contact pads. The insulating layers 230 and 234 can be SiO2, Si3N4, SiON, Ta2O5, ZrO2, Al2O3, or other material having suitable insulating properties. The deposition of insulating layer 234 may involve PVD, CVD, printing, sintering, or thermal oxidation. The insulating layer 234 can be single or multiple layers.

Circuit build-up layer 222 further includes thin film semiconductor devices, such as active devices or IPDs, such as inductors, resistors, and capacitors. The thin film semiconductor circuit elements provide in part the necessary functionality of the semiconductor device. Film encapsulants 194-196 maintain the structural integrity of conductive posts 192 during formation of the semiconductor package, including circuit build-up layer 222.

A bottom-side circuit build-up layer 236 is formed over film encapsulant 196 and conductive posts 192. Circuit build-up layer 236 includes conductive layers 238 and 242 and insulating layers 240 and 244. Conductive layer 238 and 242 can be Al, Cu, Sn, Ni, Au, Ag, or other suitable electrically conductive material. Conductive layers 238 and 242 are formed by PVD, CVD, electrolytic plating, or electroless plating process. Conductive layers 238 and 242 are electrically connected by conductive via 245. Conductive layer 238 electrically connects to conductive posts 192. Conductive layer 242 can be RDLs or external contact pads. The insulating layers 240 and 244 can be SiO2, Si3N4, SiON, Ta2O5, ZrO2, Al2O3, or other material having suitable insulating properties. The deposition of insulating layer 244 may involve PVD, CVD, printing, sintering, or thermal oxidation. The insulating layer 244 can be single or multiple layers.

Circuit build-up layer 236 further includes thin film semiconductor devices, such as active devices or IPDs, such as inductors, resistors, and capacitors. The thin film semiconductor circuit elements provide in part the necessary functionality of the semiconductor device. Film encapsulants 194-196 maintain the structural integrity of conductive posts 192 during formation of the semiconductor package, including circuit build-up layer 236.

An electrically conductive solder material is deposited over conductive layer 242 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high lead, or lead free. The solder material is reflowed by heating the material above its melting point to form spherical balls or bumps 246. In some applications, solder bumps 246 are reflowed a second time to improve electrical contact to conductive layer 242. Solder bumps 246 represent one type of interconnect structure that can be formed on conductive layer 242. The interconnect structure can also use bond wires, 3D interconnects, conductive paste, or other electrical interconnect.

Semiconductor die 204 electrically connects through contact pads 206, conductive layers 238, conductive via 245, and conductive layer 242 to solder bumps 246. Semiconductor die 204 further electrically connects through conductive posts 192 to conductive layers 228, conductive via 235, and conductive layer 232.

Figure 9:
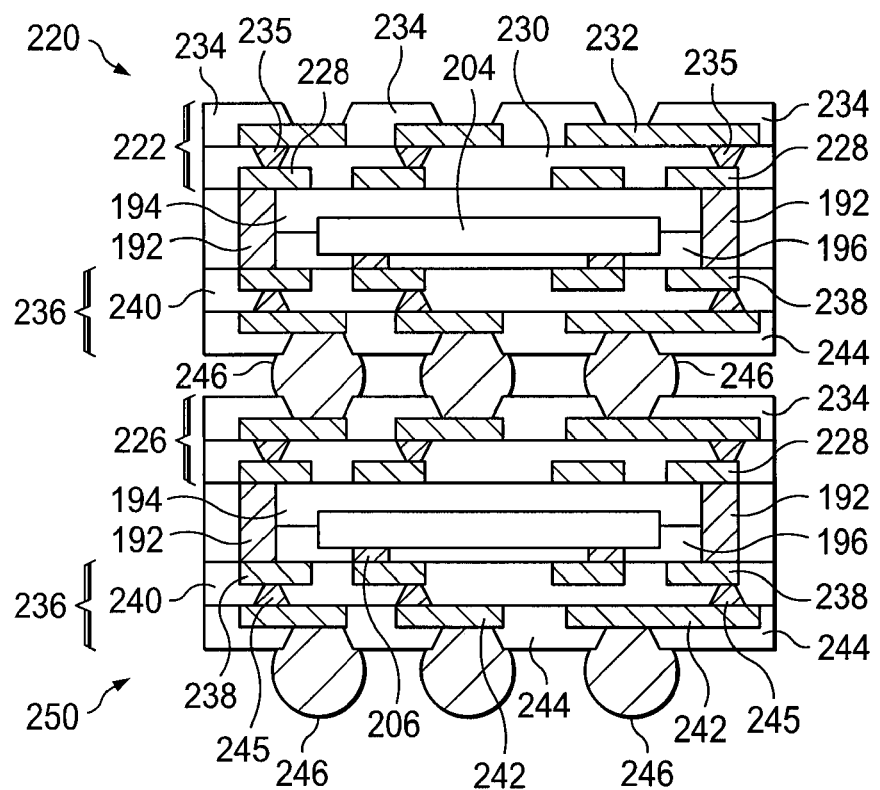
FIG. 9 illustrates stacked semiconductor packages electrically interconnected with the z-direction conductive posts embedded in multiple encapsulant layers.

FIG. 9 shows vertically stacked semiconductor packages 220 and 250. Semiconductor die 204 in semiconductor package 220 electrically connects to semiconductor die 204 in semiconductor package 250 through contact pads 206, conductive layers 228, 232, 238, and 242, conductive vias 235 and 245, conductive posts 192, and solder bumps 246.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a plurality of vertical conductive posts;
a film encapsulant disposed around the vertical conductive posts;
a semiconductor die embedded within the film encapsulant between the vertical conductive posts with the vertical conductive posts extending completely through the film encapsulant;
a first interconnect structure formed over a first surface of the film encapsulant with the first interconnect structure being electrically connected to the vertical conductive posts;
a second interconnect structure formed over the semiconductor die and a second surface of the film encapsulant opposite the first surface of the film encapsulant with the vertical conductive posts extending from the first interconnect structure to the second interconnect structure;
a first conductive layer formed between the vertical conductive posts and contact pads on the semiconductor die; and
a conductive bump formed over and exposed on a surface of the first or second interconnect structure opposite the semiconductor die.

2. The semiconductor device of claim 1, wherein the first and second interconnect structures include:
a second conductive layer; and
an insulating layer formed over the second conductive layer.

3. The semiconductor device of claim 1, further including a plurality of stacked semiconductor devices electrically connected through the first and second interconnect structures and vertical conductive posts.

4. The semiconductor device of claim 1, wherein the vertical conductive posts are arranged around the semiconductor die.

5. The semiconductor device of claim 1, wherein the film encapsulant includes a first film encapsulant overlaying a second film encapsulant.

6. A semiconductor device, comprising:
a plurality of vertical conductive posts;
an encapsulant deposited around the vertical conductive posts;
a semiconductor die embedded in the encapsulant between the vertical conductive posts with the vertical conductive posts extending completely through the encapsulant;
a first interconnect structure formed over a first surface of the encapsulant with the first interconnect structure electrically connected to the vertical conductive posts;
a first conductive layer formed between the vertical conductive posts and contact pads on the semiconductor die; and
a conductive bump formed over and exposed on a surface of the first interconnect structure opposite the encapsulant.

7. The semiconductor device of claim 6, further including a second interconnect structure formed over a second surface of the encapsulant opposite the first surface of the encapsulant with the second interconnect structure electrically connected to the vertical conductive posts.

8. The semiconductor device of claim 6, wherein the first interconnect structure includes:
a second conductive layer; and
an insulating layer formed over the second conductive layer.

9. The semiconductor device of claim 6, further including a plurality of stacked semiconductor die electrically connected through the first interconnect structure and vertical conductive posts.

10. The semiconductor device of claim 6, wherein the vertical conductive posts are arranged around the semiconductor die.

11. The semiconductor device of claim 6, wherein the encapsulant includes a first film encapsulant overlaying a second film encapsulant.

12. A semiconductor device, comprising:
a base plate including a plurality of conductive posts extending from the base plate;
an encapsulant disposed over the base plate and around the conductive posts;
a semiconductor die embedded within the encapsulant over the base plate between the conductive posts with the conductive posts extending through the encapsulant; and
a conductive layer formed between the conductive posts and contact pads on the semiconductor die.

13. The semiconductor device of claim 12, further including a first interconnect structure formed over a first surface of the encapsulant, the first interconnect structure being electrically connected to the conductive posts.

14. The semiconductor device of claim 13, further including a second interconnect structure formed over a second surface of the encapsulant opposite the first surface of the encapsulant, the second interconnect structure being electrically connected to the conductive posts.

15. The semiconductor device of claim 13, further including a plurality of stacked semiconductor die electrically connected through the first interconnect structure and conductive posts.

16. The semiconductor device of claim 12, wherein the conductive posts are arranged around the semiconductor die.

17. The semiconductor device of claim 12, wherein the encapsulant includes a first film encapsulant overlaying a second film encapsulant.

18. A semiconductor device, comprising:
a base plate including a plurality of conductive posts extending perpendicular with respect to the base plate;
an encapsulant disposed over the base plate and around the conductive posts, wherein the encapsulant includes a first film encapsulant overlaying a second film encapsulant; and
a semiconductor die embedded within the encapsulant between the conductive posts.

19. The semiconductor device of claim 18, further including a first interconnect structure formed over a first surface of the encapsulant, the first interconnect structure being electrically connected to the conductive posts.

20. The semiconductor device of claim 19, further including a second interconnect structure formed over a second surface of the encapsulant opposite the first surface of the encapsulant, the second interconnect structure being electrically connected to the conductive posts.

21. The semiconductor device of claim 20, further including a plurality of stacked semiconductor die electrically connected through the first interconnect structure and conductive posts.

22. A semiconductor device, comprising:
   a substrate, wherein the substrate includes an adhesive layer formed over a carrier;
   a base plate mounted over the substrate with the base plate including a plurality of vertical conductive posts extending from the base plate to the substrate;
   an encapsulant deposited over the vertical conductive posts; and
   a semiconductor die mounted over the substrate and embedded within the encapsulant.

23. The semiconductor device of claim 22, wherein the encapsulant includes a first film encapsulant deposited over the base plate and a second film encapsulant deposited over the first film encapsulant.

24. The semiconductor device of claim 22, wherein the vertical conductive posts surround the semiconductor die.

25. The semiconductor device of claim 22, wherein an active surface of the semiconductor die is oriented toward the substrate.

26. The semiconductor device of claim 22, wherein the vertical conductive posts are arranged in a rectangular array.

* * * * *

UNITED STATES PATENT AND TRADEMARK OFFICE
CERTIFICATE OF CORRECTION

| | | |
|---|---|---|
| PATENT NO. | : 8,354,746 B2 | Page 1 of 1 |
| APPLICATION NO. | : 13/174033 | |
| DATED | : January 15, 2013 | |
| INVENTOR(S) | : Rui Huang et al. | |

It is certified that error appears in the above-identified patent and that said Letters Patent is hereby corrected as shown below:

Title page, item (74) Attorney, Agent, or Firm - Please delete the name "Rodney" and replace with the name -- Robert --.

Signed and Sealed this
Nineteenth Day of February, 2013

Teresa Stanek Rea
*Acting Director of the United States Patent and Trademark Office*